(12) United States Patent
Yin et al.

(10) Patent No.: US 9,929,137 B2
(45) Date of Patent: Mar. 27, 2018

(54) METHOD FOR MANUFACTURING ESD PROTECTION DEVICE

(71) Applicant: Silergy Semiconductor Technology (Hangzhou) Ltd., Hangzhou (CN)

(72) Inventors: Dengping Yin, Hangzhou (CN); Shijun Wang, Hangzhou (CN); Fei Yao, Hangzhou (CN)

(73) Assignee: SILERGY SEMICONDUCTOR TECHNOLOGY (HANGZHOU) LTD., Hangzhou (CN)

( * ) Notice: Subject to any disclaimer, the term of this patent is extended or adjusted under 35 U.S.C. 154(b) by 0 days.

(21) Appl. No.: 15/606,976

(22) Filed: May 26, 2017

(65) Prior Publication Data

US 2017/0345811 A1 Nov. 30, 2017

(30) Foreign Application Priority Data

May 27, 2016 (CN) .......................... 2016 1 0364672

(51) Int. Cl.
*H01L 23/62* (2006.01)
*H01L 27/02* (2006.01)
*H01L 23/60* (2006.01)
*H02H 9/04* (2006.01)
*H01L 29/41* (2006.01)

(52) U.S. Cl.
CPC .......... *H01L 27/0248* (2013.01); *H01L 23/60* (2013.01); *H01L 23/62* (2013.01); *H01L 29/41* (2013.01); *H02H 9/04* (2013.01)

(58) Field of Classification Search
CPC ..... H01L 27/0248; H01L 29/41; H01L 23/60; H01L 23/62; H02H 9/04
See application file for complete search history.

(56) References Cited

U.S. PATENT DOCUMENTS

2009/0166721 A1* 7/2009 Denison .............. H01L 27/0262
257/328
2010/0295157 A1* 11/2010 Chao .................... H01L 27/0259
257/565

FOREIGN PATENT DOCUMENTS

CN 106229314 A 12/2016

* cited by examiner

*Primary Examiner* — Kyoug Lee
(74) *Attorney, Agent, or Firm* — Westman, Champlin & Koehler, P.A.

(57) ABSTRACT

Disclosed is a method for manufacturing an ESD protection device. The method comprises: forming a first buried layer on the semiconductor substrate; forming a first epitaxial layer on the semiconductor substrate; forming a first doped region in the first epitaxial layer and forming a second doped region surrounding the first doped region in the first epitaxial layer, wherein the semiconductor substrate and the first doped region are both of a first doping type, the buried layer and the first epitaxial layer are both of a second doping type, the first doping type is opposite to the second doping type, the first doped region and the second doped region are formed using a same first mask. The method uses the same mask to form an emitter region of the open-base bipolar transistor, and to form a barrier doped region at the periphery of the emitter region, so that the manufacture cost is reduced and the parasitic capacitance of the ESD protection device is decreased.

11 Claims, 7 Drawing Sheets

FIG. 7g form a chip, a bracelet or anti-static clothing can be used to reduce the damage of ESD. The chip having been manufactured is easily affected by ESD events between the chip and the external objects when it is used in various different environment. Therefore, an ESD protection device is provided in the chip to offer an electrostatic discharge path to effectively protect the chip, so that the reliability and service life of the integrated circuit chip is improved.

METHOD FOR MANUFACTURING ESD PROTECTION DEVICE

CROSS-REFERENCE TO RELATED APPLICATION

This application claims the benefit of Chinese Patent Application No. 201610364672.X, filed on May 27, 2016, which is incorporated herein by reference in its entirety.

BACKGROUND OF THE DISCLOSURE

Field of the Disclosure

The present disclosure relates to a semiconductor device and a method for manufacturing the same, and in particular, to a method for manufacturing an Electrostatic discharge (ESD) protection device.

Background of the Disclosure

Electrostatic discharge (ESD) is a phenomenon that releases and transfers charges between integrated circuit chips and external objects. Due to a large amount of charges being released in a short time, the energy from ESD is much higher than a chip's bearing capacity, which may result in temporary failure or even permanent damage of the chip function. During the process for manufacturing a chip, a bracelet or anti-static clothing can be used to reduce the damage of ESD. The chip having been manufactured is easily affected by ESD events between the chip and the external objects when it is used in various different environment. Therefore, an ESD protection device is provided in the chip to offer an electrostatic discharge path to effectively protect the chip, so that the reliability and service life of the integrated circuit chip is improved.

In modern electronic products such as smartphones, laptops, tablets and LED displays, ESD protection devices are widely used for providing protection to high-speed data ports mounted on printed circuit boards (PCBs), such as HDMI, USB, DVI, etc. These ESD protection devices are either separate devices or integrated into the chip. In order to protect the high-speed data ports, the ESD protection devices should have high response speed. The response speed of the ESD protection device is mainly influenced by its own capacitance. In order to increase the response speed, the capacitance of the ESD protection device is preferably set to less than 0.5 pF. Further, the ESD protection device should also have a high electrostatic discharge capability.

Figure 1:
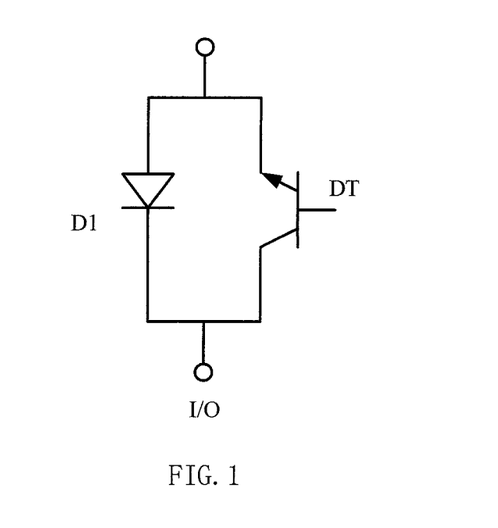
FIG. 1 shows a schematic circuit structure of an ESD protection device.

The ESD protection device can be implemented based on various circuit structures. FIG. 1 shows a schematic circuit structure of an ESD protection device. The ESD protection device includes an open-base bipolar transistor DT and a rectification diode D1 coupled in serial between an input-output terminal I/O and the ground GND. The input-output terminal I/O is, for example, a terminal of high-speed data ports. The open-base bipolar transistor DT is a open base NPN triode. When the ESD protection device is turned off, the input-output terminal I/O is used to transfer data. When electrostatic charge is released, the open-base bipolar transistor DT is turned on in the direction from the input-output terminal I/O to the ground GND, or the rectification device D1 is turned on in the direction from the ground GND to the input-output terminal I/O, thereby providing an electrostatic discharge path.

Figure 2:
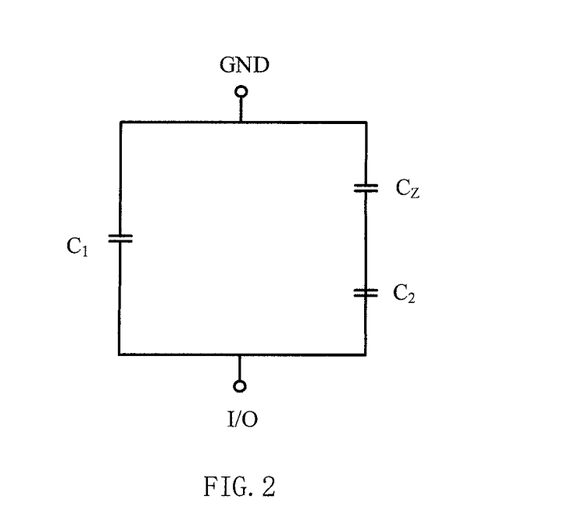
FIG. 2 shows an equivalent circuit of the parasitic capacitance of the ESD protection device shown in FIG. 1.

FIG. 2 shows an equivalent circuit of the parasitic capacitance of the ESD protection device shown in FIG. 1. In the ESD protection device, the base-emitter junction of the open-base bipolar transistor DT can be equivalent to a rectification diode, and the base-collector junction can be equivalent to a Zener diode. The parasitic capacitance of the rectification diode D1 is denoted as C1, the capacitance of the base-emitter junction in the open-base bipolar transistor DT is denoted as C2, and the capacitance of the base-collector junction is denoted as CZ. In order to obtain a large electrostatic discharge capacity, the doping concentration of the base-collector increases and the junction area increases, so that the parasitic capacitance CZ of the open-base bipolar transistor DT is much larger than C2.

Further, since the open-base bipolar transistor DT and the rectification diode D1 are connected in parallel with each other, the parasitic capacitances C2 and CZ of the open-base bipolar transistor DT are connected in series, and the equivalent capacitance C (I/O-GND) of the ESD protection device is approximately equal to (C1+C2). That is, the equivalent capacitance of the ESD protection device is mainly determined by the parasitic capacitance C1 of the rectification diode D1 and the equivalent capacitance C2 of the open-base bipolar transistor DT.

However, the conventional manufacturing method introduces an induced doped region in the open-base bipolar transistor DT, so that the equivalent capacitance C2 of the open-base bipolar transistor DT is also increased. It is desirable to further improve the manufacturing method of the ESD protection device to improve the response speed of the ESD protection device.

SUMMARY OF THE DISCLOSURE

In view of this, there is provided a method for manufacturing an ESD protection device, in which a barrier doped region is formed to reduce the parasitic capacitance of the ESD protection device.

The present disclosure provides a method for manufacturing an ESD protection device comprising:

forming a first buried layer on the semiconductor substrate;

forming a first epitaxial layer on the semiconductor substrate;

forming a first doped region in the first epitaxial layer; and forming a second doped region in the first epitaxial layer which surrounds the first doped region, wherein the semiconductor substrate and the first doped region are both of a first doping type, the buried layer and the first epitaxial layer are both of a second doping type, the first doping type and the second doping type are opposite, the first doped region and the second doped region are formed using a same first mask.

Preferably, the method further comprises: forming the first mask on the first epitaxial layer before forming the first doped region, wherein the first mask has a first opening corresponding to the first doped region.

Preferably, the method further comprises: enlarging the size of the first opening so as to expose a portion of the surface of the first epitaxial layer surrounding the first doped region between the steps of forming the first doped region and forming the second doped region.

Preferably, the size of the first opening is enlarged by reactive ion etching.

Preferably, the semiconductor substrate and the first doped region are used as a collector region and an emitter region of an open-base bipolar transistor, respectively, the first buried layer and the first epitaxial layer are used together as a base region of the open base bipolar transistor.

Preferably, the method further comprises:
forming a second buried layer in the semiconductor substrate;
forming a second epitaxial layer on the semiconductor substrate;
forming a third doped region on the second epitaxial layer;
wherein the second buried layer and the second epitaxial layer are of the first doping type, and the third doped region is of the second doped type.

Preferably, the first epitaxial layer and the second epitaxial layer are both formed by a same step of epitaxial growth.

Preferably, the first epitaxial layer and the second epitaxial layer are self-doped by the first buried layer and the second buried layer, respectively.

Preferably, the first epitaxial layer and the first doped region are used as a cathode and an anode of a rectification device, respectively.

Preferably, the method further comprises: after the steps of forming a first doped region, forming a second doped region and forming a third doped region,
forming an interlayer dielectric layer on the surfaces of the first epitaxial layer, the first doped region, the second doped region and the third doped region;
forming conductive vias in the interlayer dielectric layer which respectively reaches the first doped region and the third doped region;
forming a first electrode electrically coupled to the conductive vias, on the interlayer dielectric layer; and
forming a second electrode on the surface of the semiconductor substrate opposite to the first electrode.

Preferably, the method further comprises: after the steps of forming a first doped region, forming a second doped region and forming a third doped region,
forming an isolation structure extending from the surfaces of the first epitaxial layer and the second epitaxial layer into the semiconductor substrate for defining the respective active regions of the rectification device and the open-base bipolar transistor.

The method according to the disclosure uses a same mask to form an emitter region of the open-base bipolar transistor, and to form a barrier doped region at the periphery of the emitter region, so that the manufacture cost is reduced and the parasitic capacitance of the ESD protection device is decreased.

BRIEF DESCRIPTION OF THE DRAWINGS

The above and other objects, advantages and features of the present invention will become more fully understood from the detailed description given hereinbelow in connection with the appended drawings, and wherein.

DETAILED DESCRIPTION OF THE DISCLOSURE

Exemplary embodiments of the present disclosure will be described in more details below with reference to the accompanying drawings. In the drawings, like reference numerals denote like members. The figures are not drawn to scale, for the sake of clarity. Moreover, some well-known parts may not be shown. For simplicity, the structure of the semiconductor device having been subject to several relevant process steps may be shown in one figure.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region.

In contrast, when one layer is referred to as being "directly on" or "on and adjacent to" or "adjoin" another layer or region, there are not intervening layers or regions present. In the present application, when one region is referred to as being "directly in", it can be directly in another region and adjoins the another region, but not in a implantation region of the another region.

In the present application, the term "semiconductor structure" means generally the whole semiconductor structure formed at each step of the method for manufacturing the semiconductor device, including all of the layers and regions having been formed.

Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential for but can be varied in a specific implementation of the disclosure.

FIGS. 3 to 6 are cross-sectional diagrams of an ESD protection device according to the prior art, respectively.

Figure 3:
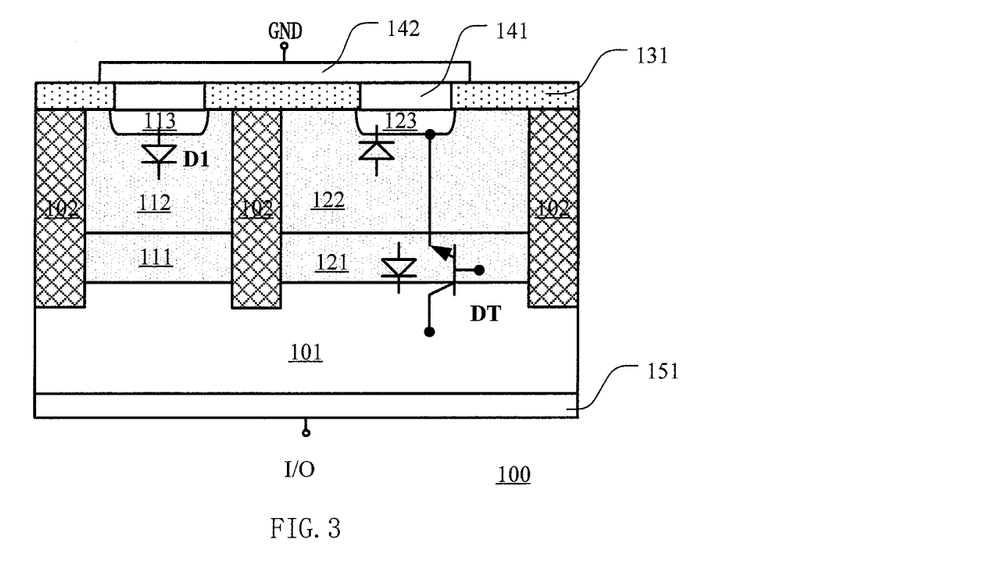
FIGS. 3 to 6 are cross-sectional diagrams of an ESD protection device according to the prior art, respectively.

As shown in FIG. 3, a conventional ESD protection device 100 includes a rectification device D1 and an open-base bipolar transistor DT coupled in parallel between the input-output terminal I/O and the ground GND. The input-output terminal I/O is, for example, a terminal of high-speed data ports. When the ESD protection device 100 is turned off, the input-output terminal I/O is used to transfer data. When electrostatic charge is released, the open-base bipolar transistor DT is turned on in the direction from the input-output terminal I/O to the ground GND, the rectification device D1 is turned on in the direction from the ground GND to the input-output terminal I/O, thereby providing an electrostatic discharge path.

The ESD protection device 100 includes a semiconductor substrate 101, a first buried layer 111 and a second buried layer 121 on the semiconductor substrate 101, a first epitaxial layer 112 on the first buried layer 111, a first doped region 113 in the first epitaxial layer 112, a second epitaxial layer 122 on the second buried layer 121, and a second doped region 123 in the second epitaxial layer 122. The semiconductor substrate 101 is of N-type. The first buried layer 111 and the first epitaxial layer 112 are each of N-type, and the first doped region 113 is of heavily doped P-type.

The semiconductor substrate 101, the first buried layer 111, the first epitaxial layer 112, and the first doped region 113 constitute a rectification device D1 in a first region of the semiconductor substrate 101, a first PN junction is formed between the first epitaxial layer 112 and the first doped region 113. The first epitaxial layer 112 and the first doped region 113 are used as a cathode and an anode of the rectification device D1, respectively.

The second buried layer 121 and the second epitaxial layer 122 are both of P-type, and the second doped region 123 is of heavily doped N-type. The semiconductor substrate 101, the second buried layer 121, the second epitaxial layer 122, and the second doped region 123 constitute an open-base bipolar transistor DT in a second region of the semiconductor substrate 101, a second PN junction is formed between the semiconductor substrate 101 and second buried layer 121, a third PN junction is formed between the second epitaxial layer 122 and the second doped region 123, and the second PN junction is reversely biased over the third PN junction. The semiconductor substrate 101 and the second doped region 123 are used as a collector region and an emitter region of the open-base bipolar transistor DZ, respectively, and the second buried layer 121 and the second epitaxial layer 122 are used together as a base region of the open-base bipolar transistor DZ.

Preferably, the ESD protection device 100 further includes an isolation structure 102. In the first region of the semiconductor substrate 101, the isolation structure 102 extends from the surface of the first epitaxial layer 112 into the semiconductor substrate 101 for defining an active region of the rectification device D1. In the second region of the semiconductor substrate 101, the isolation structure 102 extends from the surface of the second epitaxial layer 122 into the semiconductor substrate 101 for defining an active region of the open-base bipolar transistor DT. In this embodiment, the isolation structure 102 is, for example, a trench isolation, for defining the lateral flow of the current.

Preferably, the ESD protection device 100 further includes a interlayer dielectric layer 131 on the first epitaxial layer 112 and the second epitaxial layer 122. A first electrode 142 is formed on the interlayer dielectric layer 131. The first electrode 142 is electrically coupled to the first doped region 113 and the second doped region 123 via conductive vias 141 passing through the interlayer dielectric layer 131, so that the first doped region 113 and the second doped region 123 are coupled to each other. A second electrode 151 is formed on the surface of the semiconductor substrate 101 opposite to the first electrode 142. The first electrode 142 and the second electrode 151 is made of, for example, a metal material selected from the group consisting of gold, silver and copper, or an alloy thereof.

According to the above embodiment, the rectification device D1 and open-base bipolar transistor DT are integrated into one chip. In an alternative embodiment, the rectification device D1 and the open-base bipolar transistor DT form separate semiconductor devices, respectively, and the two may be electrically coupled to each other by a bonding wire.

For the ESD protection device shown in FIG. 3, it is desirable to increase the area of the PN junction of the open-base bipolar transistor DT and the doping concentration so as to allow a relatively large amount of current to flow through the PN junction during the time period of electrostatic discharge, and thus the electrostatic discharge capacity of the ESD protection device is improved. However, the response speed of the ESD protection device is reduced because the increased area of the PN junction leads to an increase in the parasitic capacitance CZ. Therefore, it is important to choose an appropriate junction area and doping concentration in the design process of the device, in order to achieve the ultimate device performance.

But, the capacitance value of the actual product of the ESD protection device 100 is generally larger than it is desired, because the charge trapping phenomenon exists in the interlayer dielectric layer 131, as shown in the following table.

TABLE 1 comparing capacitance value of actual product of ESD protection device and designed capacitance value

| ESD protection device | designed capacitance value (pF) | capacitance value of actual product (pF) |
|---|---|---|
| device A | 0.34 | 0.92 |
| device B | 0.33 | 1.84 |
| device C | 0.32 | 1 |
| device D | 0.29 | 0.77 |

Figure 4:
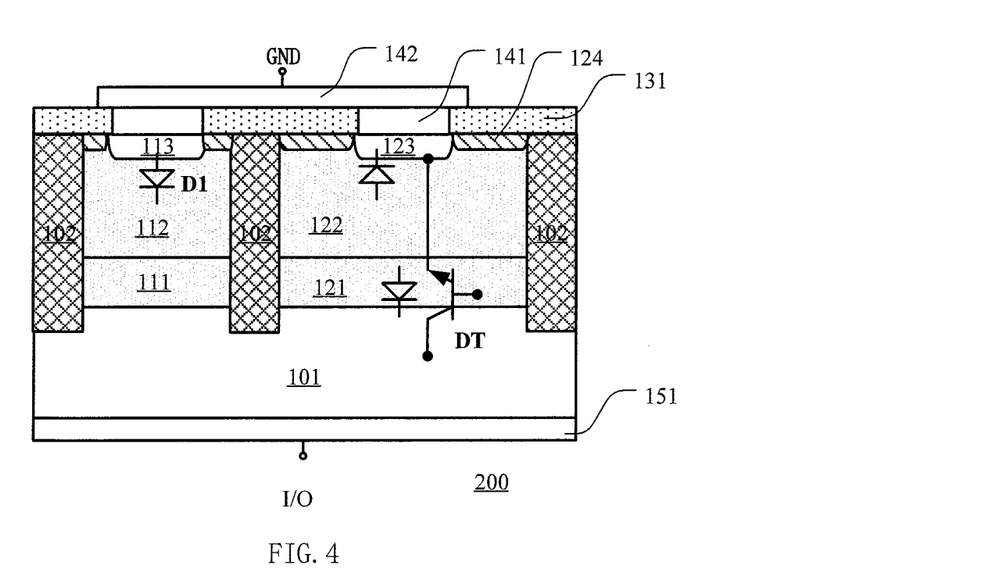

As shown in FIG. 4, the ESD protection device 200 includes the rectification device D1 and the open-base bipolar transistor DT. The interlayer dielectric layer 131 usually captures positive charge, and a third doped region 124 is formed in the surface of the first epitaxial layer 112 and the second epitaxial layer 122 located below the interlayer dielectric layer 131 due to the induction of the interlayer dielectric layer 131. in this case, the third doped region 124 is of lightly doped N-type. In the open-base bipolar transistor DT, an additional fourth PN junction is formed between the third doped region 124 and the second epitaxial layer 122, and the third PN junction and the fourth PN junction are biased in one direction and coupled in parallel, so that the area of the junction of the open-base bipolar transistor DT is significantly increased, and the capacitance of the junction of the open-base bipolar transistor DT is also increased accordingly.

In view of the above, there is provided a further improved structure in which a barrier doped region is formed around the emitter region of the open-base bipolar transistor. The barrier doped region is of a doping type opposite to that of the open-base bipolar transistor, so that the parasitic capacitance of the open-base bipolar transistor is decreased.

Figure 5:
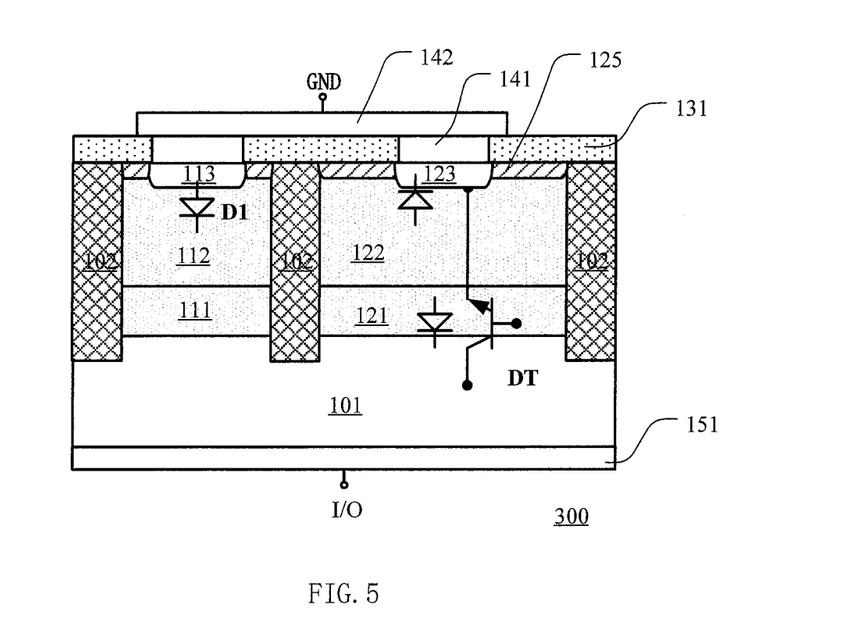

In an improved structure as shown in FIG. 5, the ESD protection device 300 includes the rectification device D1 and the open-base bipolar transistor DT. The isolation structure 102 defines the active regions of the rectification device D1 and the open-base bipolar transistor DT, respectively. A fourth doped region 125 is formed in the first epitaxial layer 112 and second epitaxial layer 122 before the interlayer dielectric layer 131 is formed. In the rectification device D1 and the open-base bipolar transistor DT, the fourth doped region 125 surrounds the first doped region 113 and the second doped region 123, respectively, and it has doping type opposite to that of the second doped region 123, for example, lightly doped P-type.

In the next steps, the interlayer dielectric layer 131 is formed on the second epitaxial layer 122. The fourth doped region 125 can provide positive charges to the interlayer dielectric layer 131, so it is used as the barrier doped region, to avoid inducing a doped region of N-type in the second epitaxial layer 122. The second doped region 123 of the open-base bipolar transistor DT is used as an emitter region. Because the fourth doped region 125 defines the area of the emitter region, the area of the junction is approximately the contact area of the second doped region 123 and the second epitaxial layer 122. Therefore, the actual product of the open-base bipolar transistor DT has a parasitic capacitance value consistent to the designed capacitance value.

Figure 6:
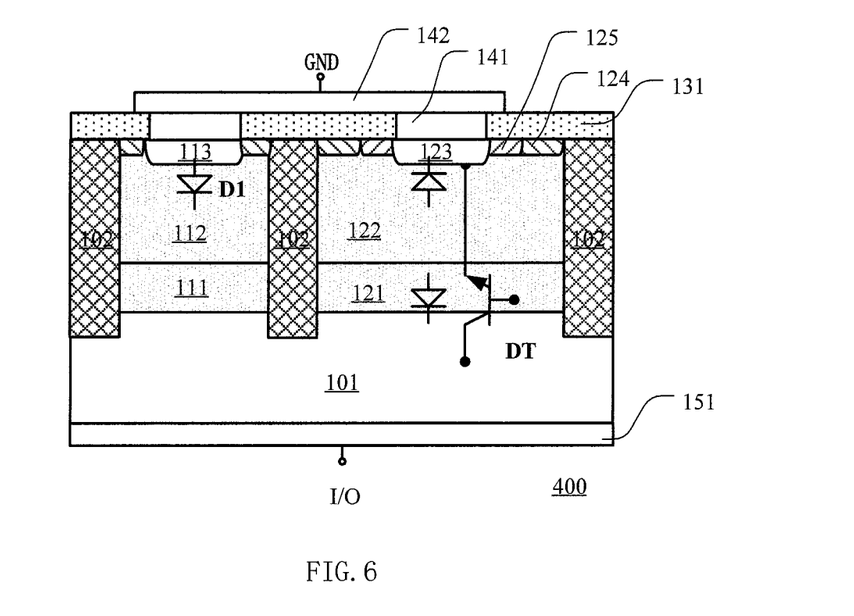

In another improved structure as shown in FIG. 6, the ESD protection device 400 includes the rectification device D1 and the open-base bipolar transistor DT. The isolation structure 102 defines the active regions of the rectification device D1 and the open-base bipolar transistor DT, respectively. The fourth doped region 125 is formed in a portion of the exposed surface of the second epitaxial layer 122 before the interlayer dielectric layer 131 is formed. In the rectification device D1 and the open-base bipolar transistor DT, the fourth doped region 125 surrounds the second doped region 123, and it is of a doping type opposite to that of the second doped region 123, for example, it is of lightly doped P-type.

In the next steps, the interlayer dielectric layer 131 is formed on the second epitaxial layer 122. The interlay dielectric layer 131 usually captures positive charges, the third doped region 124 is formed in a portion of the surfaces of the first epitaxial layer 112 and the second epitaxial layer 122, the third doped region 124 is of lightly doped N-type. The third doped region 124 surrounds the fourth doped region 125. The second doped region 123 of the open-base bipolar transistor DT is used as an emitter region. Because the fourth doped region 125 defines the area of the emitter region, the area of the junction is approximately the contact area of the second doped region 123 and the second epitaxial layer 122. Therefore, the actual product of the open-base bipolar transistor DT has a parasitic capacitance value consistent to the designed capacitance value.

In the method for manufacturing the above-mentioned ESD device, the fourth doped region 125 is formed to define the area of the emitter region. So an additional mask is formed by use of a separate photolithography process to block the first doped region 113 of the rectification device D1 and the second doped region 123 of the open-base bipolar transistor DT, and the peripheral region of the second doped region 123 is exposed via an opening. From the above, an additional photolithography process is required to form the fourth doped region 125 according to the prior art, which results in high manufacture cost.

FIGS. 7a to 7g are cross sectional diagrams at different steps of the method for manufacturing an ESD protection device according to an embodiment of the present disclosure. For example, the method is used to manufacture the ESD protection device 300 as shown in FIG. 5.

Figure 7A:
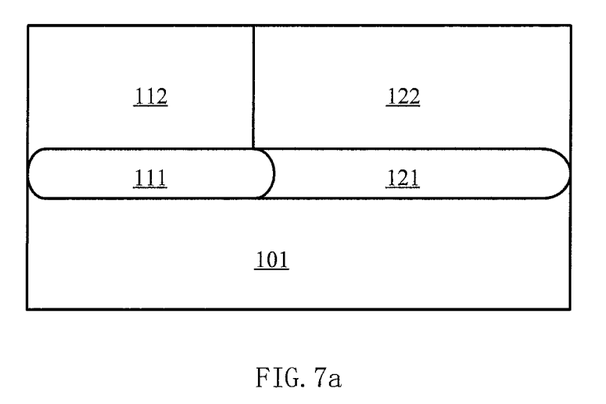
FIGS. 7a to 7g are cross sectional diagrams at different steps of the method for manufacturing an ESD protection device according to an embodiment of the present invention.

As shown in FIG. 7a, the first buried layer 111 and the second buried layer 121 are respectively formed in the adjacent first and second regions in the semiconductor substrate 101. The semiconductor substrate 101 is, for example, a single-crystal Si substrate and doped to be of N-type. For example, the first buried layer 111 and the second buried layer 121 are both doped regions respectively formed at predetermined depth below the surface of the semiconductor substrate 101. The first buried layer 111 and the second buried layer 121 are respectively doped to be of N-type and P-type.

A P-type semiconductor layer or region may be formed by implanting a P-type dopant such as B in the semiconductor layer or region. An N-type semiconductor layer or region may be formed by implanting an N-type dopant such as P or As in the semiconductor layer or region. By controlling implantation parameters, such as implantation energy and dosage, the doped region may reach a predetermined depth and may have a predetermined doping concentration.

In order to form the first buried layer 111 and the second buried layer 121 in the selected regions of the semiconductor layer 101, two different types of dopant are implanted by two ion implantations. In the two ion implantations, for example, separate photoresist masks (not shown) are formed by photolithographic process, respectively, where the openings expose the desired areas to be implanted. The ion implantation is carried out via the openings of the photoresist masks by conventional ion implantation and flooding techniques to form the first buried layer 111 and the second buried layer 121. Then, the photoresist mask is removed by ashing or dissolution with a solvent. It is noted that the first buried layer 111 and the second buried layer 121 are formed at any sequence.

In a preferable embodiment, if the doping concentration of the semiconductor layer 101 is very high, before the first buried region 111 and the second buried region 121 are formed, an additional epitaxial layer may be formed on the surface of the semiconductor substrate 101, and then the ion implantation is carried out.

Then the epitaxial semiconductor layer is epitaxially grown on the surface of the first buried layer 111 and second buried layer 121 by a known deposition process. The deposition process is, for example, one selected from the group consisting of electron beam evaporation (EBM), chemical vapor deposition (CVD), atomic layer deposition (ALD), and sputtering.

The epitaxial semiconductor layer is, for example, a N-type epitaxial layer with low or ultra low doping concentration, or an intrinsic epitaxial layer. Because of the self-doping of the first buried layer 111 and the second buried layer 121, the different regions of the epitaxial semiconductor layer are respectively doped to form the first epitaxial layer 112 and the second epitaxial layer 122. The first buried layer 111 and the second buried layer 121 are doped to be of N-type and P-type respectively, and thus the first epitaxial layer 112 located above the first buried layer 111 is self-doped to N-type, the second epitaxial layer 122 locate above the second buried layer 121 is self-doped to P-type.

It is desirable that when the rectification device D1 and the open-base bipolar transistor DT are turned on, the doping concentration of the first epitaxial layer 112 and the second epitaxial layer 122 is as low as possible so that the parasitic capacitance is reduced as much as possible. For example, the doping concentration of the first epitaxial layer 112 and the second epitaxial layer 122 is lower than 1e14 cm-3.

Figure 7B:
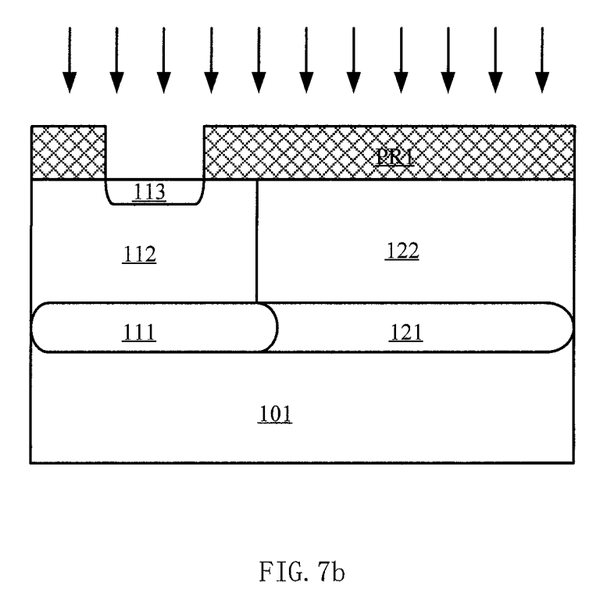

Further, the photoresist mask PR1 is formed by photolithographic process, where the opening exposes a portion of the surface of the first epitaxial layer 112. The ion implantation is carried out via the opening of the photoresist mask by conventional ion implantation and flooding techniques to form the first doped region 113 in the first epitaxial layer 112, as shown in FIG. 7b. Then, the photoresist mask is removed by ashing or dissolution with a solvent.

The first doped region 113 is a heavily doped P-type region extending downward from the surface of the first epitaxial layer 112 by a predetermined depth. The first doped region 113 and the first epitaxial layer 112 form a first PN junction, thereby respectively forming the anode and cathode of the rectification device D1.

Figure 7C:
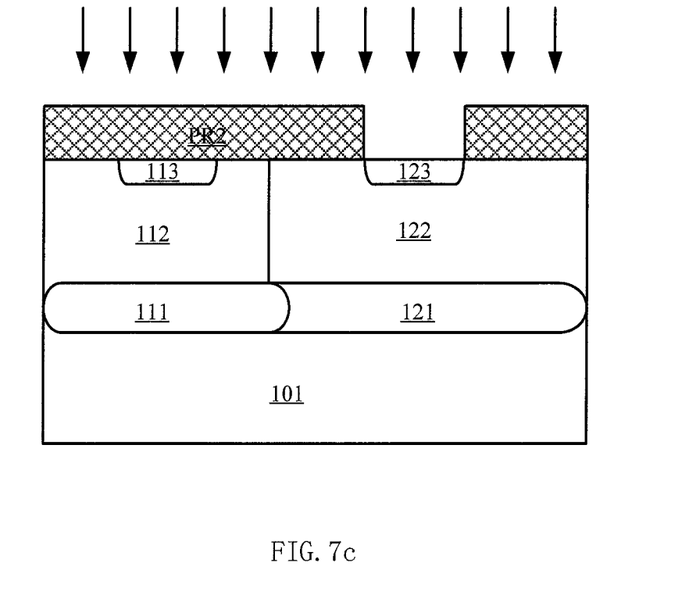

Further, the photoresist mask PR2 is formed by photolithographic process, where the opening exposes a portion of the surface of the second epitaxial layer 122. The ion implantation is carried out via the opening of the photoresist mask by conventional ion implantation and flooding techniques to form the second doped region 123 in the second epitaxial layer 122, as shown in FIG. 7c. The photoresist mask PR2 is retained after the ion implantation, which is used in subsequent steps to form an additional doped region.

The second doped region 123 is a heavily doped N-type region extending downward from the surface of the second epitaxial layer 122 by a predetermined depth. The third PN junction is formed between the semiconductor substrate 101 and the second buried layer 121, and the fourth PN junction is formed between the second doped region 123 and the second epitaxial layer 122. Therefore, the semiconductor substrate 101 and the second doped region 123 are used as a collector region and an emitter region of the open-base bipolar transistor DT, respectively, and the second buried layer 121 and the second epitaxial layer 122 are used together as a base region.

Figure 7D:
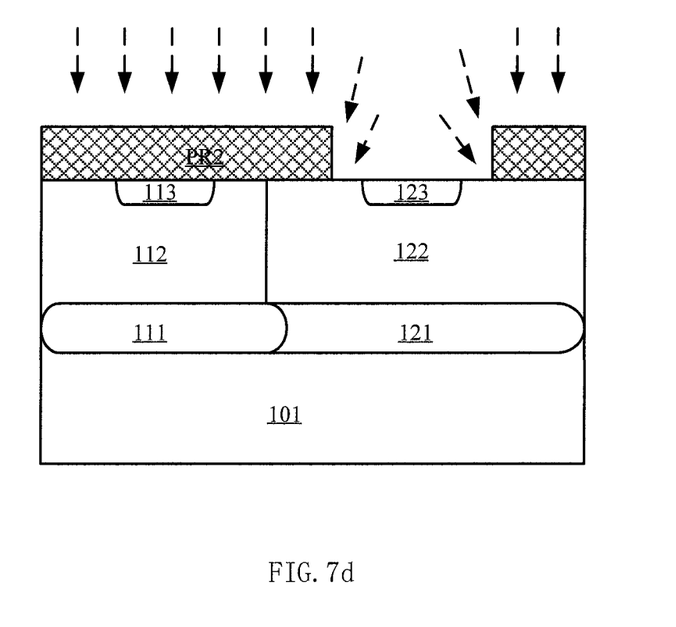

Further, the photoresist mask PR2 is etched, for example, using reactive ion etch process. For example, O2 is used as an etchant. During the etching process, the thickness of the photoresist mask PR2 is decreased and the sidewalls of the opening are gradually etched to increase the size of the opening so as to expose the peripheral area surrounding the second doped region 123, as shown in FIG. 7d.

Figure 7E:
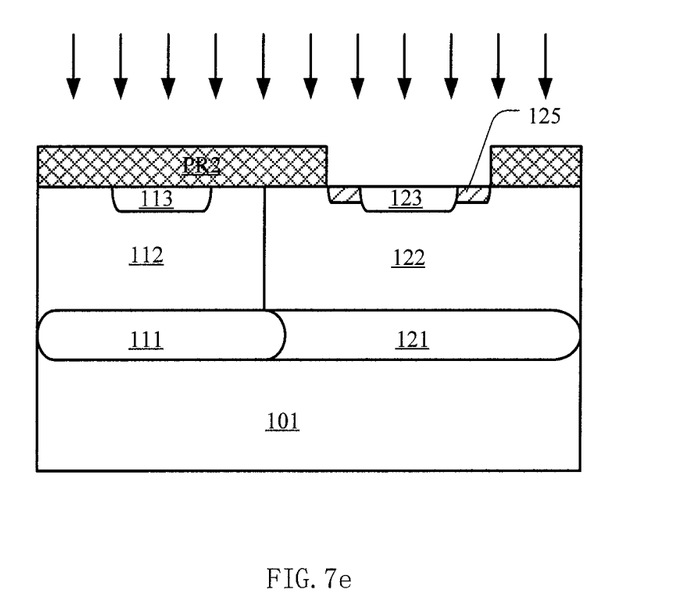

Further, the photoresist mask PR2 is formed by photolithographic process, where the opening exposes a portion of the surface of the second epitaxial layer 122 surrounding the second doped region 123. The ion implantation is carried out via the opening of the photoresist mask by conventional ion implantation and flooding techniques to form the fourth doped region 125 in the second epitaxial layer 122, as shown in FIG. 7e. Then, the photoresist mask is removed by ashing or dissolution with a solvent.

The fourth doped region 125 is a lightly doped P-type region extending downward from the surface of the second epitaxial layer 122 by a predetermined depth. The fourth doped region 125 surrounds the second doped region 123 and its doping type is opposite to that of the second doped region 123, thereby defining the area of the second doped region 123.

The doping concentration of the fourth doped region 125 is generally about 5e11cm-2~1e12 cm-2, and the doping energy is generally about 80 Kev. If the doping concentration of the fourth doped region 125 is relatively low (less than 5e11 cm-2), the fourth doped region 125 may be induced by the interlayer dielectric layer in the subsequent steps to convert to be a lightly doped N-type layer, which cannot reduce the capacitance of the ESD protection device. If the doping concentration of the fourth doped region 125 is too high (e.g., higher than 1e12 cm-2), the fourth doped region 125 contacts the second doped region 123 to form a PN junction, which causes an increase in parasitic capacitance of the open-base bipolar transistor DT. Therefore, the doping concentration of the fourth doped region 125 should be controlled at an appropriate value.

Further, the isolation structure 102 is formed for defining the active regions of the rectification device D1 and the open-base bipolar transistor DT.

The isolation structure 102 extends from the surfaces of the first epitaxial layer 112 and the second epitaxial layer 122 into the semiconductor substrate 101 at the periphery of the rectification device D1 and open-base bipolar transistor DT, for isolating the rectification device D1 from the open-base bipolar transistor DT in the ESD protection device and for isolating from the adjacent semiconductor devices.

The isolation structure 102 for example is a trench isolation. The process to form a trench isolation is known in the art, for example, it includes etching a shallow trench in a semiconductor structure and filling the shallow trench with insulating materials.

Figure 7F:
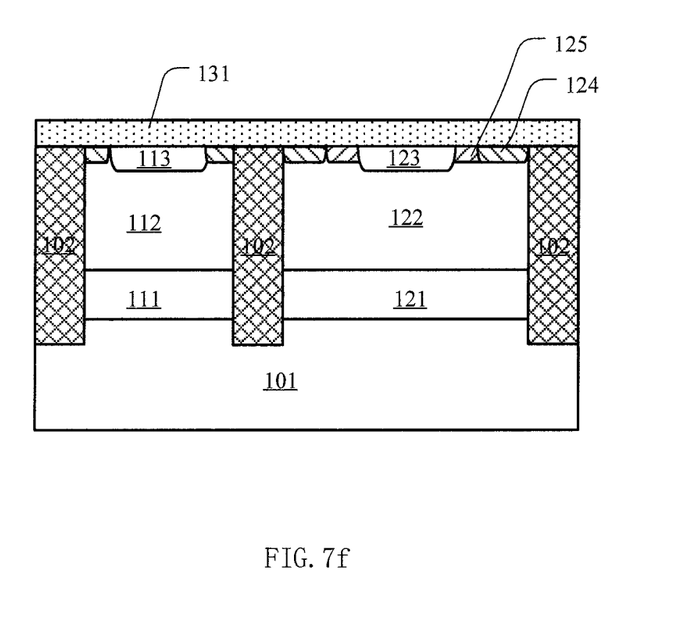

Next, the interlayer dielectric layer 131 is formed on the corresponding surface of the epitaxial semiconductor layer 102 by the above conventional deposition processes, as shown in FIG. 7f.

For example, the interlayer dielectric layer 131 is made of silicon oxide, for example. The interlay dielectric layer 131 usually captures positive charges, the third doped region 124 is formed in a portion of the surfaces of the first epitaxial layer 112 and the second epitaxial layer 122. The third doped region 124 is a lightly doped N-type region. The third doped region 124 surrounds the fourth doped region 125.

The second doped region 123 of the open-base bipolar transistor DT is used as an emitter region. Because the fourth doped region 125 defines the area of the emitter region, the area of the junction is approximately the contact area of the second doped region 123 and the second epitaxial layer 122. Therefore, the actual product of the open-base bipolar transistor DT has a parasitic capacitance value consistent to the designed capacitance value.

Further, the openings are formed in the interlayer dielectric layer 131 by photolithography and etching, which arrive at the first doped region 113 and the second doped region 123, respectively.

Figure 7G:
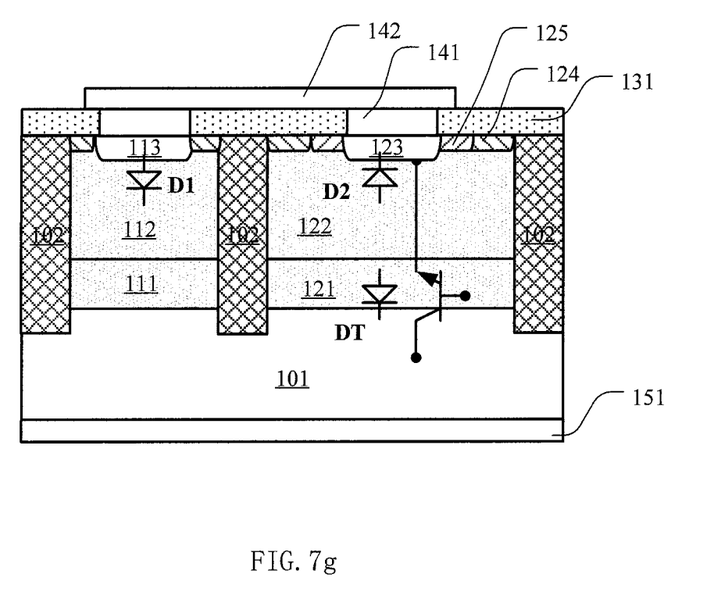

Then, as shown in FIG. 7g, the conductive vias 141 is formed in the opening of the interlayer dielectric layer 131 by the above known deposition processes and planarization process (e.g., chemical mechanical planarization), the first electrode 142 is formed on the surface of the interlayer dielectric layer 131, and the second electrode 151 is formed on the surface of the semiconductor substrate 101 opposite to the epitaxial semiconductor layer 102. The conductive vias 141, the first electrode 142 and the second electrode 151 are made of, for example, a metal material selected from the group consisting of gold, silver and copper.

According to the above embodiment, the rectification device and open-base bipolar transistor are integrated into one chip. In another alternative embodiment, the method may be used to separately manufacture the rectification device and open-base bipolar transistor, thereby forming two separate elements, and the two separate elements are couple by a bonding wire to form an ESD protection device.

The above method for defining the emitter region of the open-base bipolar transistor can be used to manufacture separate elements of the open base-bipolar transistor. In another alternative embodiment, the open-base bipolar transistor may be used alone as a one-way ESD protection device. Thus, the method for manufacturing an ESD protection device according to the embodiment of the present disclosure can also be used to manufacture an ESD protection device including only a base bipolar transistor.

It should also be understood that the relational terms such as "first", "second", and the like are used in the context merely for distinguishing one element or operation form the other element or operation, instead of meaning or implying any real relationship or order of these elements or operations. Moreover, the terms "comprise", "comprising" and the like are used to refer to comprise in nonexclusive sense, so that any process, approach, article or apparatus relevant to an element, if follows the terms, means that not only said element listed here, but also those elements not listed explicitly, or those elements inherently included by the process, approach, article or apparatus relevant to said element. If there is no explicit limitation, the wording "comprise a/an . . . " does not exclude the fact that other elements can also be included together with the process, approach, article or apparatus relevant to the element.

Although various embodiments of the present invention are described above, these embodiments neither present all details, nor imply that the present invention is limited to these embodiments. Obviously, many modifications and changes may be made in light of the teaching of the above embodiments. These embodiments are presented and some details are described herein only for explaining the principle of the invention and its actual use, so that one skilled person can practice the present invention and introduce some modifications in light of the invention. The invention is intended to cover alternatives, modifications and equivalents that may be included within the spirit and scope of the invention as defined by the appended claims.

The invention claimed is:

1. A method for manufacturing an ESD protection device, comprising:
   forming a first buried layer on a semiconductor substrate;
   forming a first epitaxial layer on said semiconductor substrate;
   forming a first doped region in said first epitaxial layer; and
   forming a second doped region in said first epitaxial layer which surrounds said first doped region,
   wherein said semiconductor substrate and said first doped region are both of a first doping type, said buried layer and said first epitaxial layer are both of a second doping type, said first doping type and said second doping type are opposite,
   said first doped region and said second doped region are formed using a same first mask.

2. The method according to claim 1, further comprising:
   forming said first mask on said first epitaxial layer before forming said first doped region, wherein said first mask has a first opening corresponding to said first doped region.

3. The method according to claim 2, further comprising:
   enlarging size of said first opening to expose a portion of said surface of said first epitaxial layer surrounding said first doped region between said steps of forming said first doped region and forming said second doped region.

4. The method according to claim 3, wherein said size of said first opening is enlarged by reactive ion etching.

5. The method according to claim 1, wherein said semiconductor substrate and said first doped region are used as a collector region and an emitter region of an open-base bipolar transistor, respectively, said first buried layer and said first epitaxial layer are used together as a base region of said open-base bipolar transistor.

6. The method according to claim 1, further comprising:
   forming a second buried layer in said semiconductor substrate;
   forming a second epitaxial layer on said semiconductor substrate; and forming a third doped region in said second epitaxial layer,
   wherein said second buried layer and said second epitaxial layer are of said first doping type, and said third doped region is of said second doped type.

7. The method according to claim 6, wherein said first epitaxial layer and said second epitaxial layer are both formed by a same step of epitaxial growth.

8. The method according to claim 7, wherein said first epitaxial layer and said second epitaxial layer are self-doped by said first buried layer and said second buried layer, respectively.

9. The method according to claim 6, wherein said first epitaxial layer and said first doped region are used as a cathode and an anode of a rectification device, respectively.

10. The method according to claim 6, further comprising: after said steps of forming a first doped region, forming a second doped region and forming a third doped region,
   forming an interlayer dielectric layer on surfaces of said first epitaxial layer, said first doped region, said second doped region and said third doped region;
   forming conductive vias in said interlayer dielectric layer which respectively reaches said first doped region and said third doped region; forming a first electrode on said interlayer dielectric layer which is electrically coupled to said conductive vias; and
   forming a second electrode on a surface of said semiconductor substrate opposite to said first electrode.

11. The method according to claim 6, further comprising: after said steps of forming a first doped region, forming a second doped region and forming a third doped region,
   forming an isolation structure extending from said surfaces of said first epitaxial layer and said second epitaxial layer into said semiconductor substrate for defining said respective active regions of said rectification device and said open-base bipolar transistor.

* * * * *